(12) United States Patent
Nishioka et al.

(10) Patent No.: US 9,269,903 B2
(45) Date of Patent: Feb. 23, 2016

(54) METHOD OF MANUFACTURING VARIABLE RESISTANCE ELEMENT AND APPARATUS FOR MANUFACTURING THE SAME

(75) Inventors: Yutaka Nishioka, Shizuoka (JP); Kazumasa Horita, Shizuoka (JP); Natsuki Fukuda, Shizuoka (JP); Shin Kikuchi, Shizuoka (JP); Youhei Ogawa, Shizuoka (JP); Koukou Suu, Shizuoka (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 14/122,966

(22) PCT Filed: Jun. 7, 2012

(86) PCT No.: PCT/JP2012/003725
§ 371 (c)(1),
(2), (4) Date: Nov. 27, 2013

(87) PCT Pub. No.: WO2012/169194
PCT Pub. Date: Dec. 13, 2012

(65) Prior Publication Data
US 2014/0102879 A1    Apr. 17, 2014

(30) Foreign Application Priority Data

Jun. 8, 2011   (JP) ................................ 2011-128169

(51) Int. Cl.
*C23C 14/24*   (2006.01)
*H01L 45/00*   (2006.01)
(Continued)

(52) U.S. Cl.
CPC ............ *H01L 45/1625* (2013.01); *C23C 14/08* (2013.01); *C23C 14/3464* (2013.01);*C23C14/3492* (2013.01); *C23C 14/542* (2013.01); *C23C 14/548* (2013.01); *H01J 37/34* (2013.01); *H01J 37/3426* (2013.01); *H01J 37/3429* (2013.01); *H01L 27/101* (2013.01); *H01L 45/04* (2013.01); *H01L 45/146* (2013.01)

(58) Field of Classification Search
CPC .... C23C 14/08; C23C 14/083; C23C 14/082; C23C 14/548; C23C 14/542
USPC ..................................................... 204/298.26
See application file for complete search history.

(56) References Cited

U.S. PATENT DOCUMENTS 5,922,177  A  *  7/1999   Iketani et al. ............ 204/192.15
2005/0011748 A1 *  1/2005   Beck et al. ............... 204/192.12
(Continued)

FOREIGN PATENT DOCUMENTS

JP         03241617 A   *  10/1991
JP      2007134603 A      5/2007
(Continued)

OTHER PUBLICATIONS

International Search Report in International Application No. PCT/JP2012/003725, filed Jun. 7, 2012.
(Continued)

*Primary Examiner* — Jason M Berman
(74) *Attorney, Agent, or Firm* — Saliwanchik, Lloyd & Eisenschenk

(57) ABSTRACT

[Object] To provide a method and an apparatus for manufacturing a variable resistance element by which a metal oxide layer having a desired resistivity can be precisely formed.
[Solving Means] The method of manufacturing the variable resistance element according to an embodiment of the present invention includes a step of forming a first metal oxide having a first resistivity and a step of forming a second metal oxide having a second resistivity different from the first resistivity. The first metal oxide is formed on a substrate by sputtering, while sputtering a first target made of an oxide of metal, a second target made of the metal with a first power. The second metal oxide layer is formed on the first metal oxide layer by sputtering the second target with a second power different from the first power while sputtering the first target.

8 Claims, 7 Drawing Sheets

(51) Int. Cl.
  *C23C 14/54* (2006.01)
  *C23C 14/08* (2006.01)
  *C23C 14/34* (2006.01)
  *H01J 37/34* (2006.01)
  *H01L 27/10* (2006.01)

(56) References Cited

U.S. PATENT DOCUMENTS

2008/0117664 A1 5/2008 Kinoshita et al.
2009/0283736 A1 11/2009 Kanzawa et al.
2010/0065803 A1 3/2010 Choi et al.

FOREIGN PATENT DOCUMENTS

| | | |
|---|---|---|
| JP | 2008-244018 A | 10/2008 |
| JP | 2009-068075 A | 4/2009 |
| JP | 2010-021381 A | 1/2010 |
| JP | 2010-177387 A | 8/2010 |
| WO | WO-2007/013174 A1 | 2/2007 |
| WO | WO-2007/138646 A1 | 12/2007 |
| WO | WO-2008/149484 A1 | 12/2008 |

OTHER PUBLICATIONS

Office Action dated Jul. 20, 2015 in Korean Application No. 10-2014-7021896.

* cited by examiner

Distribution ±42.9%

Distribution ±4.5%

METHOD OF MANUFACTURING VARIABLE RESISTANCE ELEMENT AND APPARATUS FOR MANUFACTURING THE SAME

CROSS-REFERENCE TO RELATED APPLICATIONS

This application is the U.S. national stage application of International Patent Application No. PCT/JP2012/003725, filed Jun. 7, 2012, which claims priority to Japanese Patent Application No. 2011-128169, filed Jun. 8, 2011, the disclosures of each of which are incorporated herein by reference in their entirety.

TECHNICAL FIELD

The present invention relates to a method of manufacturing a variable resistance element used as a non-volatile memory or the like and relates to an apparatus for manufacturing the same.

BACKGROUND ART

A semiconductor memory includes a volatile memory such as a DRAM (Dynamic Random Access Memory) and a non-volatile memory such as a flash memory. As the non-volatile memory, a NAND flash memory or the like is known, and as a device capable of attaining further miniaturization, a ReRAM (Resistance RAM) is attracting attention.

A ReRAM uses a variable resistor, the resistance value of which is changed by applying a pulse voltage thereto, as a resistance element. Typically, the variable resistor has the structure in which two or more metal oxide layers having different oxidation degrees, that is, different resistivities are sandwiched by upper and lower electrodes. As a method of forming a layer structure of oxides having different oxidation degrees, there is known a method of forming a metal oxide by so-called reactive sputtering in which a target made of metal is sputtered in an oxygen atmosphere. For example, Patent Document 1 discloses a method of layering an n-type transition metal oxide layer having a high oxygen concentration and a p-type transition metal oxide layer having a low oxygen concentration by reducing a supply amount of oxygen while sputtering a target made of metal.

Patent Document 1: Japanese Patent Application Laid-open No. 2008-244018 (paragraphs [0036] and [0037])

SUMMARY OF INVENTION

Problem to be Solved by the Invention

However, a change in resistivity of a metal oxide layer with respect to a change in oxygen flow rate is large, so it is not easy to control the resistivity of the metal oxide layer on the basis of the supply amount of an oxidation gas, and it is difficult to form a metal oxide layer having a desired resistivity. Further, due to adsorption or the like of introduced oxygen on a target surface or a shield (deposition preventive plate) surface, a resistivity distribution is likely to be generated in a wafer plane or between wafers, and it is difficult to control the distribution. For this reason, it is impossible to form a metal oxide layer having a desired resistivity with high precision.

In view of the above-mentioned circumstances, it is an object of the present invention to provide a method of manufacturing a variable resistance element and an apparatus for manufacturing the same which are capable of forming a metal oxide layer having a desired resistivity with high precision.

Means for Solving the Problem

In order to attain the above object, a method of manufacturing a variable resistance element according to an embodiment of the present invention includes a step of forming a first metal oxide having a first resistivity and a step of forming a second metal oxide having a second resistivity different from the first resistivity.

The first metal oxide is formed on a substrate by sputtering, while sputtering a first target made of an oxide of metal, a second target made of the metal with a first power.

The second metal oxide layer is formed on the first metal oxide layer by sputtering the second target with a second power different from the first power while sputtering the first target.

An apparatus for manufacturing a variable resistance element according to an embodiment of the present invention includes a vacuum chamber, a first sputtering cathode, a second sputtering cathode, and a control unit.

The first sputtering cathode is attached to the vacuum chamber and includes a first target made of an oxide of metal.

The second sputtering cathode is attached to the vacuum chamber and includes a second target made of the metal.

The control unit has a switching unit that sequentially switches between a first state in which the second target is sputtered with a first power while sputtering the first target and a second state in which the second target is sputtered with a second power different from the first power while sputtering the first target.

BEST MODE(S) FOR CARRYING OUT THE INVENTION

Figure 1:
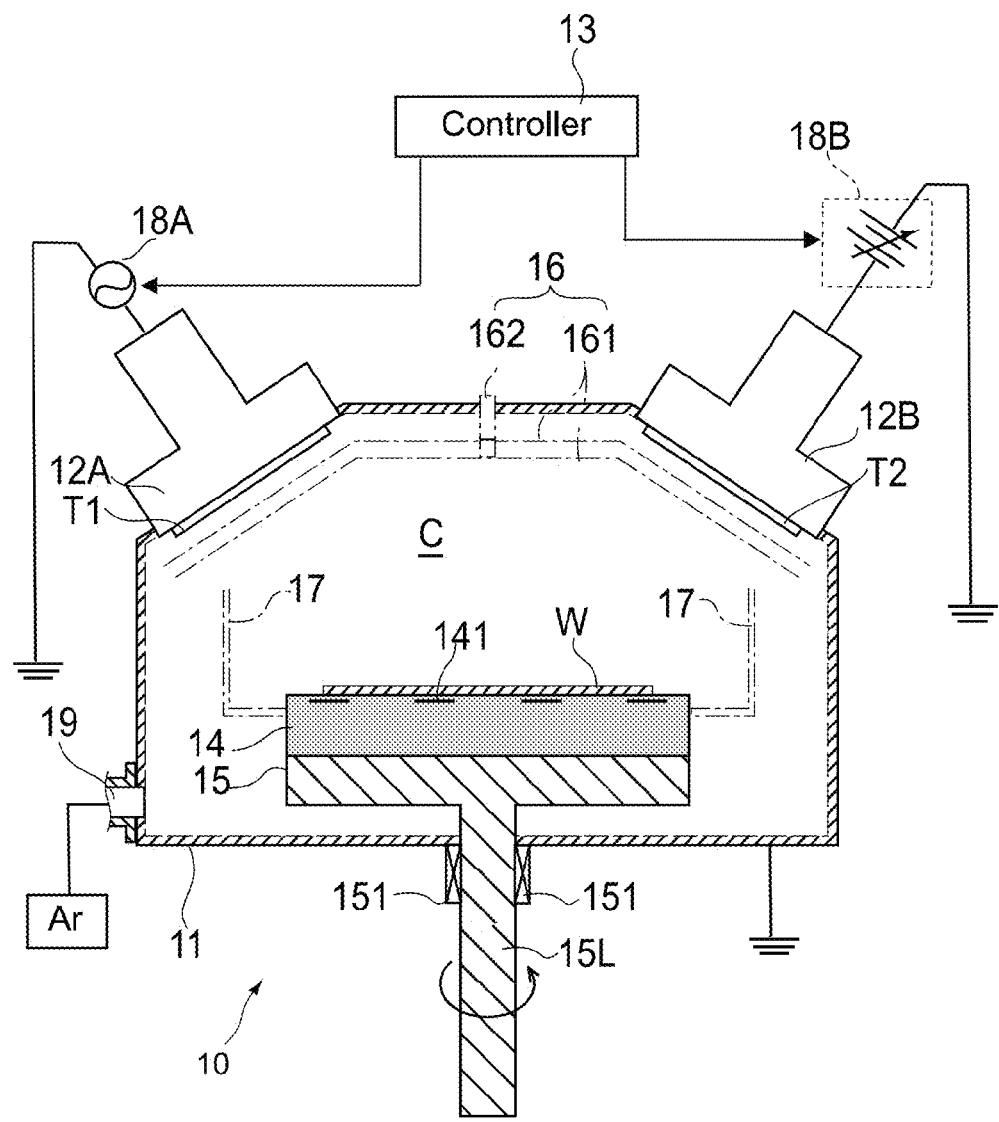
FIG. 1 A cross-sectional view showing an apparatus for manufacturing a variable resistance element according to a first embodiment of the present invention.

A method of manufacturing a variable resistance element according to an embodiment of the present invention includes a step of forming a first metal oxide having a first resistivity and a step of forming a second metal oxide having a second resistivity different from the first resistivity.

The first metal oxide is formed on a substrate by sputtering, while sputtering a first target made of an oxide of metal, a second target made of the metal with a first power.

The second metal oxide layer is formed on the first metal oxide layer by sputtering the second target with a second power different from the first power while sputtering the first target.

In the method of manufacturing the variable resistance element, the first target made of the oxide of the metal and the second target made of the metal are sputtered at the same time to carry out film formation. At this time, by changing target power, oxidation degrees of the metal oxide layers to be formed are controlled. As a result, it is possible to form the metal oxide layers each having a desired oxidation degree, that is, resistivity with high precision.

The first metal oxide layer may be formed by sputtering the second target with the first power while sputtering the first target with a third power.

The second metal oxide layer may be formed by sputtering the second target with the second power while sputtering the first target with the third power.

As a result, it is possible to control the resistivities of the metal oxide layers to be formed only by the power for the second target without changing the power for the first target.

Both of the first metal oxide layer and the second metal oxide layer may be formed by performing sputtering with the use of a noble gas.

As a result, it is possible to control the resistivities of the metal oxide layers with higher precision with an influence of a gas that contributes to plasma formation suppressed.

The oxide material that forms the first target and the metal material that forms the second target are not particularly limited. For example, the first target is made of a tantalum oxide, and the second target is made of tantalum.

An apparatus for manufacturing a variable resistance element according to an embodiment of the present invention includes a vacuum chamber, a first sputtering cathode, a second sputtering cathode, and a control unit.

The first sputtering cathode is attached to the vacuum chamber and includes a first target made of an oxide of metal.

The second sputtering cathode is attached to the vacuum chamber and includes a second target made of the metal.

The control unit has a switching unit that sequentially switches between a first state in which the second target is sputtered with a first power while sputtering the first target and a second state in which the second target is sputtered with a second power different from the first power while sputtering the first target.

The control unit of the apparatus for manufacturing the variable resistance element has the switching unit that sequentially switches between the first state and the second state in which the sputtering power for the second target differs from each other. The resistivities of the metal oxide layers can be controlled with high precision by the sputtering power for the second target, so it is possible to form a layered structure of the metal oxides having different resistivities.

Hereinafter, an embodiment of the present invention will be described with reference to the drawings.

First Embodiment

Structure of Apparatus for Manufacturing Variable Resistance Element

FIG. 1 is a cross-sectional view showing an apparatus for manufacturing a variable resistance element according to an embodiment of the present invention. In this embodiment, the manufacturing apparatus is formed of a sputtering apparatus. A sputtering apparatus 10 is provided with a vacuum chamber 11, a sputtering cathode 12A and a sputtering cathode 12B attached to the vacuum chamber 11, and a controller 13.

In the vacuum chamber 11, a treatment chamber C is formed, and the treatment chamber C can be depressurized to a predetermined vacuum with an evacuating means (not shown). Further, a gas introduction tube 19 for introducing an argon (Ar) gas into the treatment chamber C is attached from a periphery of the vacuum chamber 11 to the treatment chamber C.

A substrate support table 14 is disposed on approximately the center of the vacuum chamber 11, and an electrostatic chuck electrode 141 is provided therein as appropriate. With this structure, it is possible to bring a wafer W into intimate contact with a surface of the substrate support table 14. Further, around the substrate support table 14, a shield 17 is provided to suppress sputtered particles from adhering to an inner wall of the vacuum chamber 11.

The substrate support table 14 is disposed on a base 15. The base 15 includes a rotation shaft 15L attached on a center portion of a lower surface thereof and is configured to be rotatable by a drive source (not shown) such as a motor. With this structure, a substrate rotation mechanism that causes the wafer W to rotate around the center thereof is configured. It should be noted that the rotation shaft 15L is attached to the vacuum chamber 11 with a bearing mechanism (not shown) or a sealing mechanism 151 such as a magnetic fluid seal.

The sputtering cathode 12A and the sputtering cathode 12B are attached so upper portions of the vacuum chamber 11 with the cathodes tilted at predetermined angles so that the sputtered particles are incident in an oblique direction to a normal direction of the wafer W. To the sputtering cathode 12A and the sputtering cathode 12B, a target T1 and a target T2 are provided respectively so as to face the treatment chamber C. Further, so each of the sputtering cathodes 123 and 12B, a backing plate for supporting the targets T1 and T2 so that the targets can be cooled, a magnetic circuit for forming a magnetic field on surfaces of the targets T1 and T2, and the like are provided, although not shown.

The target T1 is formed of a tantalum oxide ($TaO_x$), for example. The material of the target T1 is not limited to this, and a binary oxide of a transition metal such as $ZrO_x$, $HfO_x$, $TiO_x$, $AlO_x$, $SiO_x$, $FeO_x$, $NiO_x$, $CoO_x$, $MnO_x$, $SnO_x$, $ZnO_x$, $VO_x$, $WO_x$, and $CuO_x$ can be used.

The target T2 is formed of a metal material such as tantalum (Ta). The material of the target T2 is not limited to this, and the transition metal used for the target T1 can be used.

It should be noted that the number of sputtering cathodes is not limited to two, and three or more sputtering cathodes may be provided. The sputtering cathodes are not limited to be used at the same time and may be used individually. In this case, a shutter mechanism 16 for selecting the target used for the film formation is provided in the treatment chamber The shutter mechanism 16 is provided with a plurality of shielding plates 161 and a rotation shaft 162 that causes the shielding plates 161 to individually rotate. The shielding plates 161 are each formed of an umbrella-shaped metal plate capable of covering all the sputtering cathodes, and openings are formed in corresponding portions of the sputtering cathodes in advance. Then, the rotation shaft 162 is driven to appropriately adjust rotation positions of 161, with the result that any one or two or more sputtering targets to be opened can be selected. It should be noted that the number of shielding plates 161 is not limited to that of the example shown in the figure.

The target T1 is connected to an RF power supply 18A provided outside the vacuum chamber 11. The RF power supply 18A has a frequency of 13.56 MHz and power of 500 W, for example. On the other hand, the target T2 is connected to a variable power supply 18B provided outside the vacuum chamber 11. The variable power supply 18B is formed of a variable DC power supply. A power variable range of the variable power supply 18B is 10 to 450 W, for example.

The controller 13 (control unit) is typically formed of a computer and controls entire operations of the sputtering apparatus 10, that is, the evacuating means, the gas flow rate, the electrostatic chuck electrode 141, the RF power supply 18A, the variable power supply 18B, and the like. The controller 13 is provided outside the vacuum chamber 11.

The controller 13 sequentially switches between a first state in which the target T2 is sputtered with a first power P1 while sputtering the target T1 and a second state in which the target T2 is sputtered with a second power P2 while sputtering the first target T1. In this embodiment, the variable power supply 18B is formed of the variable DC power supply, and the variable power supply 18B serves as a switching unit that switches between the first state and the second state.

In this embodiment, the first power P1 is set to be lower than the second power P2. The first power P1 is set to 500 W, for example, and the second power P2 is set to 200 W, for example.

Figure 2:
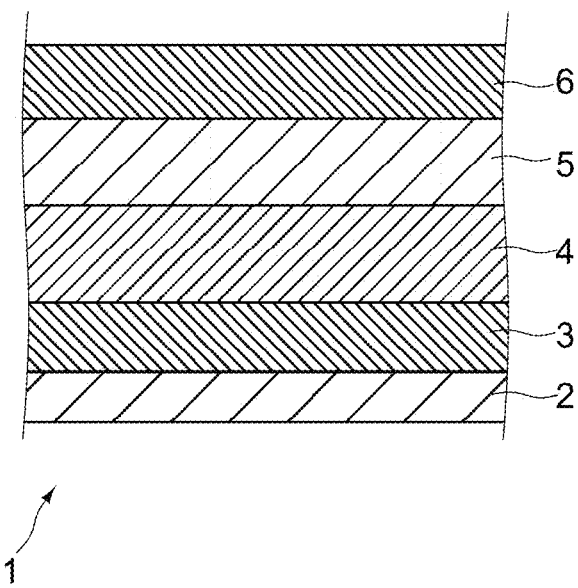
FIG. 2 A schematic diagram showing the structure of the variable resistance element according to the first embodiment of the present invention.

The sputtering apparatus 10 manufactures a variable resistance element schematically shown in FIG. 2, for example. Next, the structure of the variable resistance element will be described.

(Structure of Variable Resistance Element)

FIG. 2 is a schematic diagram showing the structure of a variable resistance element 1 according to this embodiment. The variable resistance element 1 includes a substrate 2, a lower electrode layer 3, a first metal oxide layer 4, a second metal oxide layer, and an upper electrode layer 6.

For the substrate 2, for example, a silicon substrate or the like can be used, but a material thereof is not particularly limited.

The lower electrode layer 3 is formed on the substrate 2 and made of Ta in this embodiment. It should be noted that the material is not limited to this, and a transition metal, such as Hf, Zr, Ti, Al, Fe, Co, Mn, Sn, Zn, Cr, V, and W, an alloy of these (a silicon alloy such as TaSi, WSi, and TiSi, a nitrogen compound such as TaN, WaN, TiN, and TiAlN, or a carbon alloy such as TaC), or the like can be used, for example.

The first metal oxide layer 4 is formed on the lower electrode layer 3 and is formed of $TaO_x$ in this embodiment. Here, $TaO_x$ used for the first metal oxide layer 4 is an oxide having a composition close to a stoichiometric composition. It should be noted that the material is not limited to this, and a binary oxide of a transition metal such as $ZrO_x$, $HfO_x$, $TiO_x$, $AlO_x$, $SiO_x$, $FeO_x$, $NiO_x$, $CoO_x$, $MnO_x$, $SnO_x$, $ZnO_x$, $VO_x$, $WO_x$, and $CuO_x$ can be used, for example. Further, a resistivity of the metal oxide layer 4 is not limited as long as a desired element characteristic can be obtained, and the resistivity is a value larger than $10^6$ $\Omega$cm, for example.

The second metal oxide layer 5 is formed on the first metal oxide layer 4 and is formed of $TaO_x$ in this embodiment. Here, $TaO_x$ used for the second metal oxide layer 5 has an oxidation degree lower than $TaO_x$ that constitutes the in metal oxide layer 4 and includes a large number of oxygen defects. It should be noted that the material is not limited to this, and a binary oxide of a transition metal such as $ZrO_x$, $HfO_x$, $TiO_x$, $AlO_x$, $SiO_x$, $FeO_x$, $NiO_x$, $CoO_x$, $MnO_x$, $SnO_x$, $ZnO_x$, $VO_x$, $WO_x$, and $CuO_x$ can be used, for example. The second metal oxide layer 5 may be formed of the same oxide as the first metal oxide layer 4 or an oxide different therefrom. Further, a resistivity of the second metal oxide layer 5 only has to be set to a value lower than the resistivity of the first metal oxide layer 4 and falls within a range of more than 1 $\Omega$cm and $10^6$ $\Omega$cm or less.

The upper electrode layer 6 is formed on the second metal oxide layer 5 and is formed of Ta in this embodiment. It should be noted that the material is not limited to this, and a transition metal, such as Hf, Zr, Ti, Al, Fe, Co, Mn, Sn, Zn, Cr, V, and W, an alloy of these metals (a silicon alloy such as TaSi, WSi, and TiSi, a nitrogen compound such as TaN, WaN, TiN, and TiAlN, or a carbon alloy such as TaC), or the like can be used, for example.

The first metal oxide layer 4 of the variable resistance element 1 has a higher oxidation degree than the second metal oxide layer 5 and therefore has a higher resistivity than the second metal oxide layer. Here, when a positive voltage and a negative voltage are applied to the upper electrode layer 6 and the lower electrode layer 3, respectively, oxygen ions ($O^{2-}$) in the first metal oxide layer 4 having the higher resistance are scattered in the second metal oxide layer 5 having the lower resistance, and the resistance of the first metal oxide layer 4 is decreased (low resistance state). On the other hand, when the positive voltage and the negative voltage are applied to the lower electrode layer 3 and the upper electrode layer 6, respectively, $O^{2-}$ are scattered from the second metal oxide layer 5 to the first metal oxide layer 4, and the oxidation degree of the first metal oxide layer 4 is increased again, and thus the resistance thereof is increased (high resistance state).

That is, by controlling the voltages between the lower electrode layer 3 and the upper electrode layer 6, the first metal oxide layer 4 is subjected to reversible switching between the low resistance state and the high resistance state. Further, the low resistance state and the high resistance state are maintained even if the voltage is not applied, so the variable resistance element 1 can be used as a non-volatile memory element.

Next, a method of manufacturing the variable resistance element 1 by using the sputtering apparatus 10 will be described.

(Method of Manufacturing Variable Resistance Element)

The method of manufacturing the variable resistance element 1 includes the following four steps. That is, the method includes a step of forming the lower electrode layer 3, a step of forming the first metal oxide layer 4, a step of forming the second metal oxide layer 5, and a step of forming the upper electrode layer 6. Hereinafter, those steps will be described.

(Formation of Lower Electrode Layer)

As a method of forming the lower electrode layer 3, for example, a deposition, a sputtering method, a CVD method, an ALD method, or the like is adopted. In this embodiment, by the sputtering apparatus 10, the lower electrode layer 3 is formed. In this case, only the target T2 released by the shutter mechanism 16 is sputtered.

In this case, the substrate 2 is placed on the substrate support table 14 in the treatment chamber C depressurized to the predetermined vacuum, and an Ar gas is introduced into the treatment chamber C as a sputtering gas. Then, the target T2 is sputtered while rotating the substrate support table 14 at a predetermined rotation speed, thereby making it possible to form the lower electrode layer 3 having high thickness uniformity on the substrate 2. The power supplied to the target T2 at this time is not particularly limited and is 200 W, for example.

(Formation of First Metal Oxide Layer)

Next, on the lower electrode layer 3, the first metal oxide layer 4 is formed. The Ar gas is introduced into the treatment chamber C through the gas introduction tube 19 at a predetermined flow rate. The shutter mechanism 16 releases the target T1 and the target T2. Then, the controller 13 causes the target T1 and the target T2 to be sputtered at the same time in the first state. As a result, the first metal oxide layer 4 having high thickness uniformity is formed on an entire surface of the lower electrode layer 3.

(Formation of Second Metal Oxide Layer)

Subsequently, the second metal oxide layer 5 is formed. In this step, the controller 13 causes the targets T1 and T2 to be sputtered at the same time in the second state. As a result, the second metal oxide layer 5 having high thickness uniformity is formed on an entire surface of the first metal oxide layer 4.

In this embodiment, the power of the RF power supply 18A is maintained to be constant through the step of forming the first metal oxide layer 4 and the step of forming the second metal oxide layer 5. In other words, by adjusting only the power of the variable power supply 18B, a sputtering rate for the target T2 is controlled to control the resistivities of the first metal oxide layer 4 and the second metal oxide layer 5.

Figure 3:
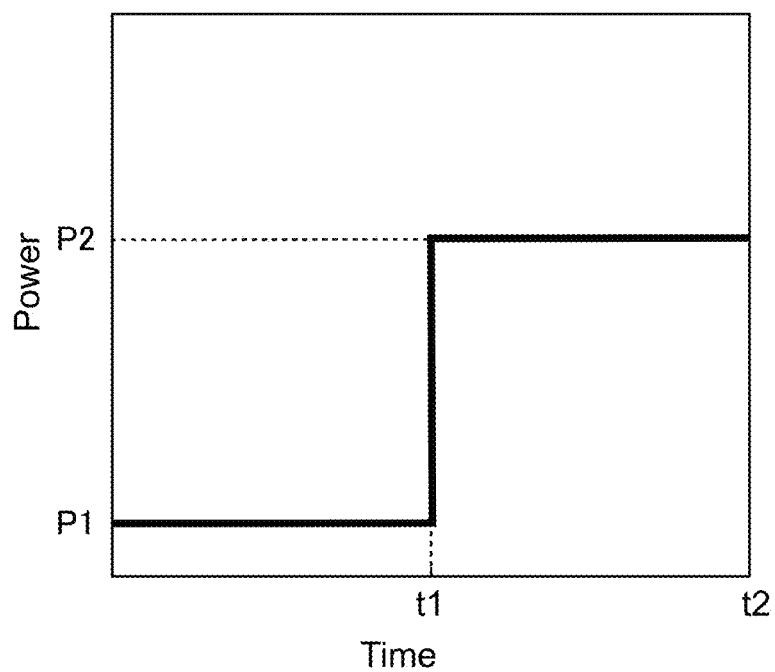
FIG. 3 A schematic diagram showing a change over time of power supplied to a metal oxide target at a time of forming a first metal oxide layer and a second metal oxide layer according to the first embodiment of the present invention.

FIG. 3 is a timing chart showing a change in power of the variable power supply 18B at a time of the formation of the first metal oxide layer 4 and the second metal oxide layer 5. An axis of abscissa represents time, and an axis of ordinate represents power. The controller 13 sequentially switches the power of the power supply 18B from P1 to P2. During a time period, from a start of sputtering to a time t1, the first metal oxide layer 4 is formed, and during a time period from the time t1 to a time t2, the second metal oxide layer 5 is formed. The times t1 and t2 are set in accordance with magnitudes of the powers P1 and P2, film thicknesses to be required, or the like.

(Formation of Upper Electrode Layer)

Subsequently, on the second metal oxide layer 5, the upper electrode layer 6 is formed. The upper electrode layer 6 can be formed in the same way as the lower electrode layer 3, and in this embodiment, the upper electrode layer 6 is formed by the sputtering apparatus 10.

As described above, in the method of manufacturing the variable resistance element 1 according to this embodiment, by changing the sputtering power supplied to the target T2, the oxidation degrees of the first metal oxide layer 4 and the second metal oxide layer 5 to be formed are controlled.

Figure 4:
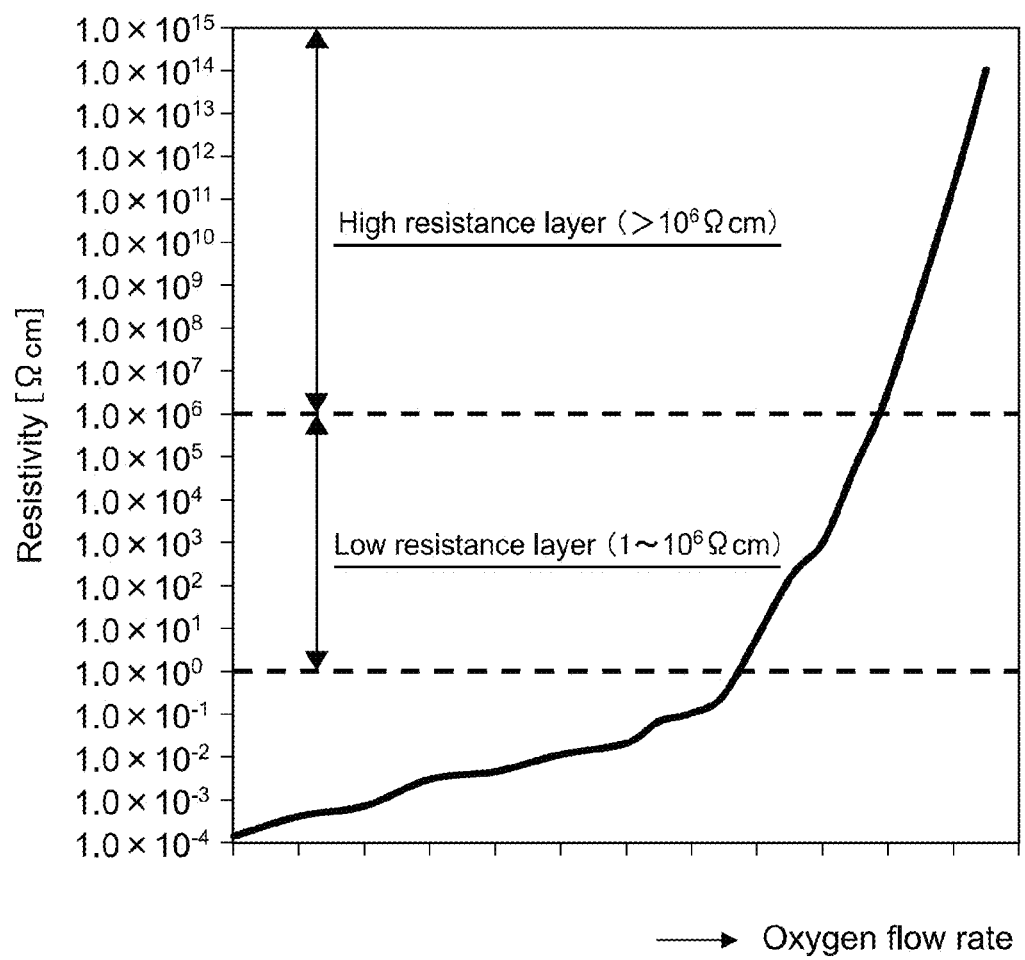
FIG. 4 A diagram showing a change in resistivity of a formed metal oxide layer at a time when a metal target is used to be sputtered by a noble gas and an oxygen gas, and a flow rate of the oxygen gas is changed.

For example, in the case where the oxidation degree of a metal oxide layer is controlled by the sputtering method, a reactive sputtering method for a metal target in an oxidizing atmosphere is used. A resistivity of the metal oxide layer formed by this method generally shows an oxygen flow rate dependence property as shown in FIG. 4. FIG. 4 shows an experimental result that shows a relationship between an oxygen flow rate and a resistivity of the metal oxide layer at a time when the metal oxide layer was formed by sputtering a Ta target in the oxidizing atmosphere.

As shown in FIG. 4, it was found that, at a time when the metal oxide layer having a resistivity larger than 1 Ωcm was formed, a change in resistivity with respect to the oxygen flow rate became significant. This may be because, when the oxygen flow rate is increased, the oxidation of the target progresses, and the oxidation degree of the metal oxide layer to be formed is likely to increase. Therefore, in order to form the second metal oxide layer 5 having the resistivity of more than 1 Ωcm and $10^6$ Ωcm or less, it is necessary to adjust the oxygen flow rate with very high precision, which involves a difficulty.

Figure 5:
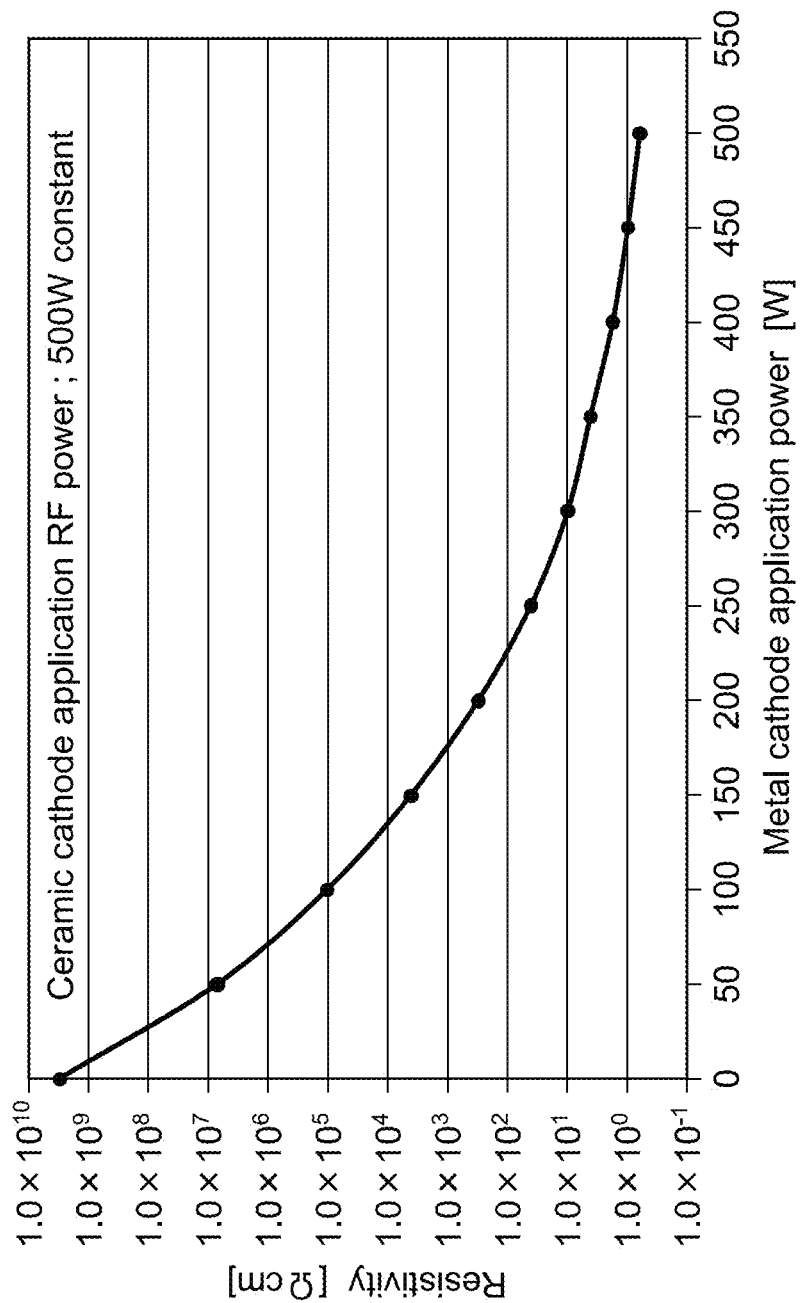
FIG. 5 A diagram showing a change in resistivity of a formed metal oxide layer at a time when a metal target and a metal oxide target are sputtered at the same time, and supply power to the metal target is changed.

On the other hand, in this embodiment, by adjusting the voltage, the resistivity is controlled. FIG. 5 shows an experimental result that shows a change in resistivity of the formed metal oxide layer at a time when a metal target and a metal oxide target were sputtered at the same time, and a supply power to the metal target was changed. At this time, a supply power to the metal oxide target was set to be constant, and Ar was used as the sputtering gas.

As shown in FIG. 5, the supply power to the metal target corresponding to the resistivity of more than 1 Ωcm and $10^6$ Ωcm or less was gradually changed. This may be because a reactive gas is not used to suppress an influence due to a gas introduced, and thus a stable sputtering can be performed. Therefore, when the second metal oxide layer 5 according to this embodiment is formed, it is also possible to control the resistivity with high precision by adjusting only the power of the variable power supply 18B.

In addition, when the resistivity is adjusted on the basis of the oxygen flow rate, a distribution of the resistivity is likely to be generated in a wafer plane or between wafers due to oxidation or the like on the surface of the target or the surface of the shield, and it is difficult to control the distribution. Subsequently, an example in which the metal oxide layer was formed by the method according to this embodiment is compared with an example in which the metal oxide layer was formed by controlling the resistivity by adjusting the oxygen flow rate, and the effect of the present invention will be further described.

Figure 6A:
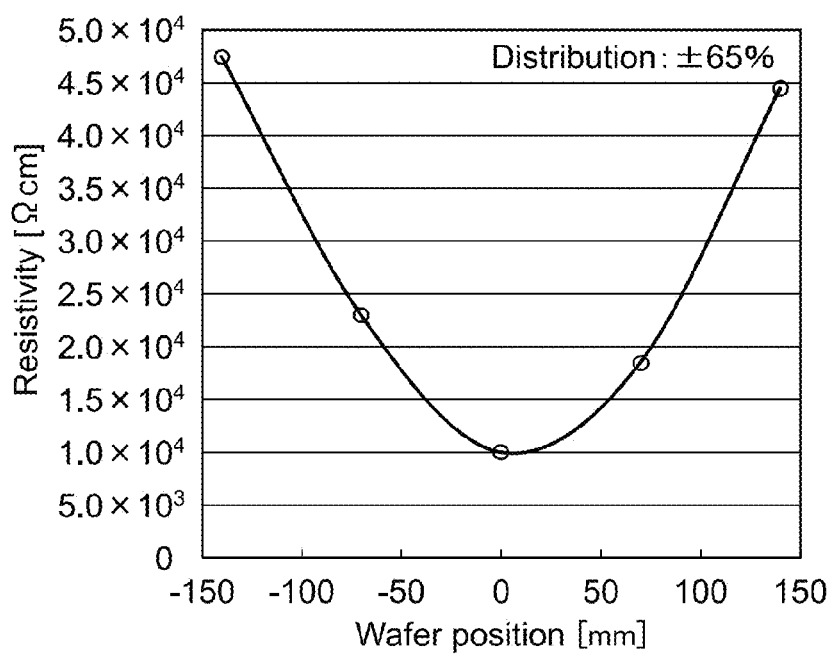
FIG. 6A An experimental result showing an in-wafer distribution of the resistivity of the metal oxide layer in the case where the resistivity is controlled by adjusting an oxygen flow rate.
Figure 6B:
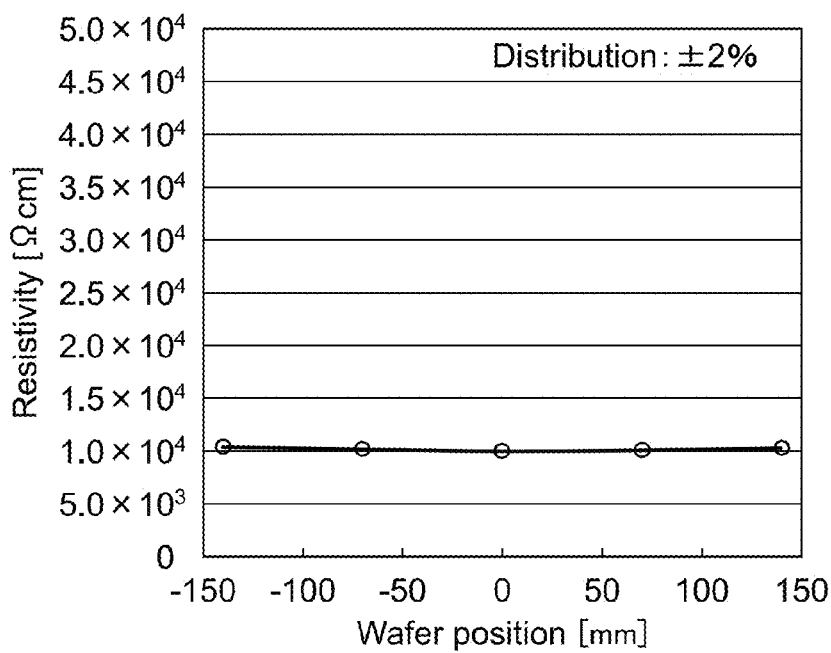
FIG. 6B An experimental result showing an in-wafer distribution of the resistivity of the metal oxide layer in the case where the resistivity is controlled by controlling the supply power to the metal target.
Figure 7A:
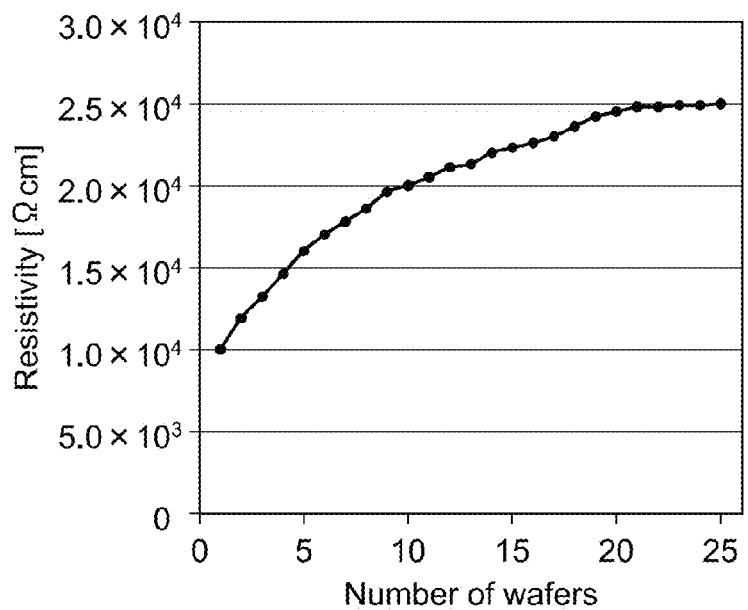
FIG. 7A An experimental result showing an inter-wafer distribution of the resistivity of the metal oxide layer in the case where the resistivity is controlled by adjusting the oxygen flow rate.
Figure 7B:
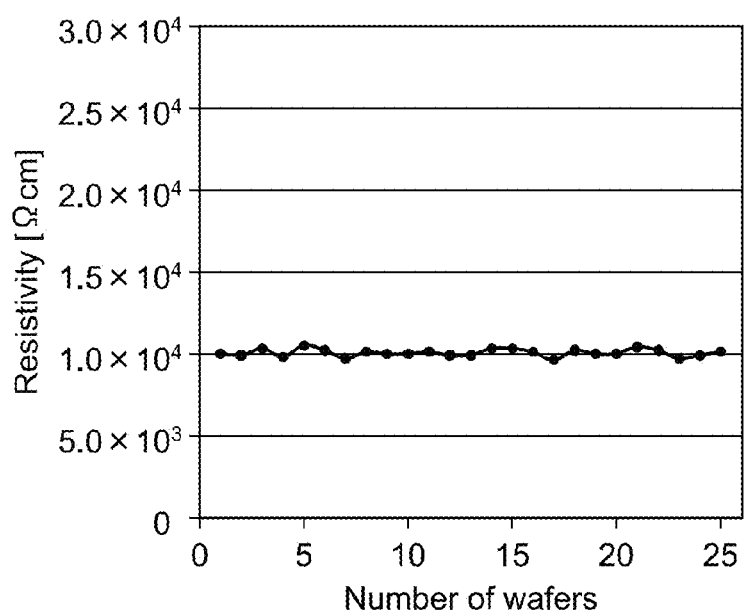
FIG. 7B An experimental result showing an inter-wafer distribution of the resistivity of the metal oxide layer in the case where the resistivity is controlled by controlling the supply power to the metal target.

FIGS. 6A and 6B each show an experimental result showing an in-wafer distribution of the resistivity of the metal oxide layer. FIGS. 7A and 7B each show an experimental result showing an inter-wafer distribution of the resistivity of the metal oxide layer at a time when a plurality of wafers was successively sputtered. FIGS. 6A and 7A each show the case where the resistivity was controlled by adjusting the oxygen flow rate, and FIGS. 6B and 7B each show the case where the resistivity was controlled by the method according to this embodiment, that is, by controlling the supply power to the metal target. In the experiments, 12-inch wafers were used.

In FIG. 6A, the in-wafer distribution is shown in which the resistivity is low in a part close to the center of the wafer, and the resistivity becomes higher with distance from the center. In actuality, the resistivity distribution in the plane of the wafer is ±65%. This may be because an oxygen gas reacts on a surface of a shield disposed around a substrate support table and in a periphery of the wafer, and the amount of the oxygen gas that reacts with sputtered particles in the center part of the wafer is decreased.

On the other hand, in FIG. 6B, the resistivity shows a uniform in-wafer distribution in range of ±2%. This may be because a reactive gas is not used for the sputtering to suppress an influence due to a gas introduced, and thus the metal oxide layer having a uniform oxidation degree can be formed.

In FIG. 7A, as the number of wafers that are subjected to the successive sputtering is increased, the resistivity is increased, and the resistivity distribution between wafers is ±42.9%. This may be because the oxidation of the metal target by the oxygen gas progresses, as time required for the sputtering passes, and the oxidation degree of the sputtered particles is increased, with the result that the oxidation degree of the metal oxide layer formed is increased.

On the other hand, in FIG. 7B, the resistivity distribution between the wafers is ±4.5%, which is approximately uniform. This may be because the reactive gas is not used for the sputtering to suppress a change in target composition over time, and thus a stable sputtering can be performed. Therefore, in this embodiment, when the plurality of metal oxide layers is successively formed, it is also possible to control the resistivity between wafers with high precision.

As described above, according to this embodiment, the metal oxide layer having a desired oxidation degree, that is, resistivity can be formed with high precision, with the result that a variable resistance element having an intended electric property can be stably manufactured.

The embodiment of the present invention is described above, but the present invention is not limited to this and can be variously modified on the basis of the technical idea of the present invention.

For example, in the above embodiment, the supply power to the target T2 is controlled, but the supply power to the target T1 may also be controlled when necessary.

Further, in the above embodiment, the variable resistance element in which the first metal oxide layer 4 has the resistivity higher than the second metal oxide layer 5 is manufactured. Instead, it is also possible to manufacture a variable resistance element in which the second metal oxide layer 5 has the resistivity higher than the first metal oxide layer 4.

In the above embodiment, only Ar is used as the sputtering gas, a mixed gas with another gas may be used when necessary.

DESCRIPTION OF SYMBOLS 1 variable resistance element
2 substrate
3 lower electrode layer
4 first metal oxide layer
5 second metal oxide layer
6 upper electrode layer
10 sputtering apparatus
11 vacuum chamber
12A, 12B sputtering cathode
13 controller
14 substrate support table
18A RF power supply
18B variable power supply
T1, T2 target

The invention claimed is:

1. A method of manufacturing a variable resistance element, comprising:
    depositing a first electrode layer on a substrate;
    depositing a first metal oxide layer having a first resistivity on the first electrode layer by sputtering, while sputtering a first target made of a metal oxide, a second target made of the metal of the metal oxide with a first power;
    depositing a second metal oxide layer having a second resistivity different from the first resistivity on the first metal oxide layer by sputtering the second target with a second power different from the first power while sputtering the first target; and
    depositing a second electrode layer on the second metal oxide layer.

2. The method of manufacturing a variable resistance element according to claim 1, wherein
    the first metal oxide layer is formed by sputtering the second target with the first power while sputtering the first target with a third power, and
    the second metal oxide layer is formed by sputtering the second target with the second power while sputtering the first target with the third power.

3. The method of manufacturing a variable resistance element according to claim 1, wherein
    the first metal oxide layer and the second metal oxide layer are formed by performing the sputtering by using a noble gas.

4. The method of manufacturing a variable resistance element according to claim 1, wherein
    the first target is made of a tantalum oxide, and
    the second target is made of tantalum.

5. The method of manufacturing a variable resistance element according to claim 2, wherein
    the first metal oxide layer and the second metal oxide layer are formed by performing the sputtering by using a noble gas.

6. The method of manufacturing a variable resistance element according to claim 2, wherein the first target is made of a tantalum oxide, and the second target is made of tantalum.

7. The method of manufacturing a variable resistance element according to claim 3, wherein the first target is made of a tantalum oxide, and the second target is made of tantalum.

8. The method of manufacturing a variable resistance element according to claim 5, wherein the first target is made of a tantalum oxide, and the second target is made of tantalum.

* * * * *